(12) United States Patent
Chu et al.

(10) Patent No.: US 9,627,093 B2
(45) Date of Patent: *Apr. 18, 2017

(54) MEMORY DEVICE HAVING RRAM-BASED NON-VOLATILE STORAGE ARRAY AND REPAIR FUNCTION

(71) Applicant: TAIWAN SEMICONDUCTOR MANUFACTURING CO., LTD., Hsinchu (TW)

(72) Inventors: Wen-Ting Chu, Kaohsiung (TW); Yue-Der Chih, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/842,815

(22) Filed: Sep. 1, 2015

(65) Prior Publication Data
US 2015/0371721 A1    Dec. 24, 2015

Related U.S. Application Data

(63) Continuation of application No. 14/079,386, filed on Nov. 13, 2013, now Pat. No. 9,153,343.

(51) Int. Cl.
*G11C 11/00* (2006.01)
*G11C 29/00* (2006.01)
(Continued)

(52) U.S. Cl.
CPC ........ *G11C 29/76* (2013.01); *G11C 13/0002* (2013.01); *G11C 13/0021* (2013.01); *G11C 13/0023* (2013.01); *G11C 29/027* (2013.01); *G11C 13/0069* (2013.01); *G11C 2029/4402* (2013.01)

(58) Field of Classification Search
USPC .............. 365/148, 200, 201, 185.09, 189.05, 365/230.08
See application file for complete search history.

(56) References Cited

U.S. PATENT DOCUMENTS

5,699,306 A    12/1997   Lee et al.
5,726,930 A    3/1998    Hasegawa et al.
(Continued)

OTHER PUBLICATIONS

U.S. Office Action dated Nov. 13, 2014 issued in U.S. Appl. No. 14/079,386.
(Continued)

*Primary Examiner* — Connie Yoha
(74) *Attorney, Agent, or Firm* — McDermott Will & Emery LLP (57) ABSTRACT

A device includes a storage region, and a resistive-read-access-memory-based (RRAM-based or ReRAM-based) non-volatile storage array is disclosed herein. The storage region includes a first storage array and a second storage array. The first storage array includes a plurality of first storage cells. The second storage array includes a plurality of second storage cells. The second storage cells are configured to be in place of the first storage cells. The RRAM-based non-volatile storage array is configured to record at least one corresponding relationship between the first storage cells and the second storage cells.

20 Claims, 5 Drawing Sheets

(51) Int. Cl.
*G11C 29/02* (2006.01)
*G11C 13/00* (2006.01)
*G11C 29/44* (2006.01)

(56) References Cited

U.S. PATENT DOCUMENTS

| | | | |
|---|---|---|---|
| 5,808,944 A | 9/1998 | Yoshitake et al. | |
| 6,084,807 A | 7/2000 | Choi | |
| 6,367,030 B1* | 4/2002 | Yamauchi | G11C 29/76 |
| | | | 365/200 |
| 6,728,133 B2 | 4/2004 | Shimizu | |
| 8,248,871 B2 | 8/2012 | Park et al. | |
| 9,153,343 B2* | 10/2015 | Chu | G11C 29/027 |
| 2013/0235644 A1* | 9/2013 | Chung | G11C 17/16 |
| | | | 365/103 |
| 2014/0104966 A1* | 4/2014 | Oh | G11C 16/20 |
| | | | 365/189.12 |
| 2015/0003141 A1* | 1/2015 | Son | G11C 29/785 |
| | | | 365/96 |
| 2016/0078968 A1* | 3/2016 | Park | G11C 29/78 |
| | | | 365/96 |

OTHER PUBLICATIONS

U.S. Notice of Allowance dated Jun. 1, 2015 issued in U.S. Appl. No. 14/079,386.

* cited by examiner

MEMORY DEVICE HAVING RRAM-BASED NON-VOLATILE STORAGE ARRAY AND REPAIR FUNCTION

RELATED APPLICATIONS

The present application is a continuation application of U.S. application Ser. No. 14/079,386 filed on Nov. 13, 2013, the disclosure of which is hereby incorporated by reference herein in its entirely.

BACKGROUND

In a memory device, e-fuses are typically used as a one-time-programmable (OTP) element to record important information (such as repair information). For example, e-fuses are programmed by applying currents through the e-fuses to completely break them or make their resistances significantly higher, such that high resistance states and low resistance states of the e-fuses are utilized to indicate logic "0" and logic "1" respectively.

BRIEF DESCRIPTION OF THE DRAWINGS

The invention can be more fully understood by reading the following detailed description of the embodiment, with reference made to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

As used herein, the term "and/or" includes any and all combinations of one or more of the associated listed items.

As used herein, the terms "comprising," "including," "having," "containing," "involving," and the like are to be open-ended, i.e., to mean including but not limited to.

In this document, the term "coupled" may be termed as "electrically coupled", and the term "connected" may be termed as "electrically connected". "Coupled" and "connected" may also be used to indicate that two or more elements cooperate or interact with each other.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
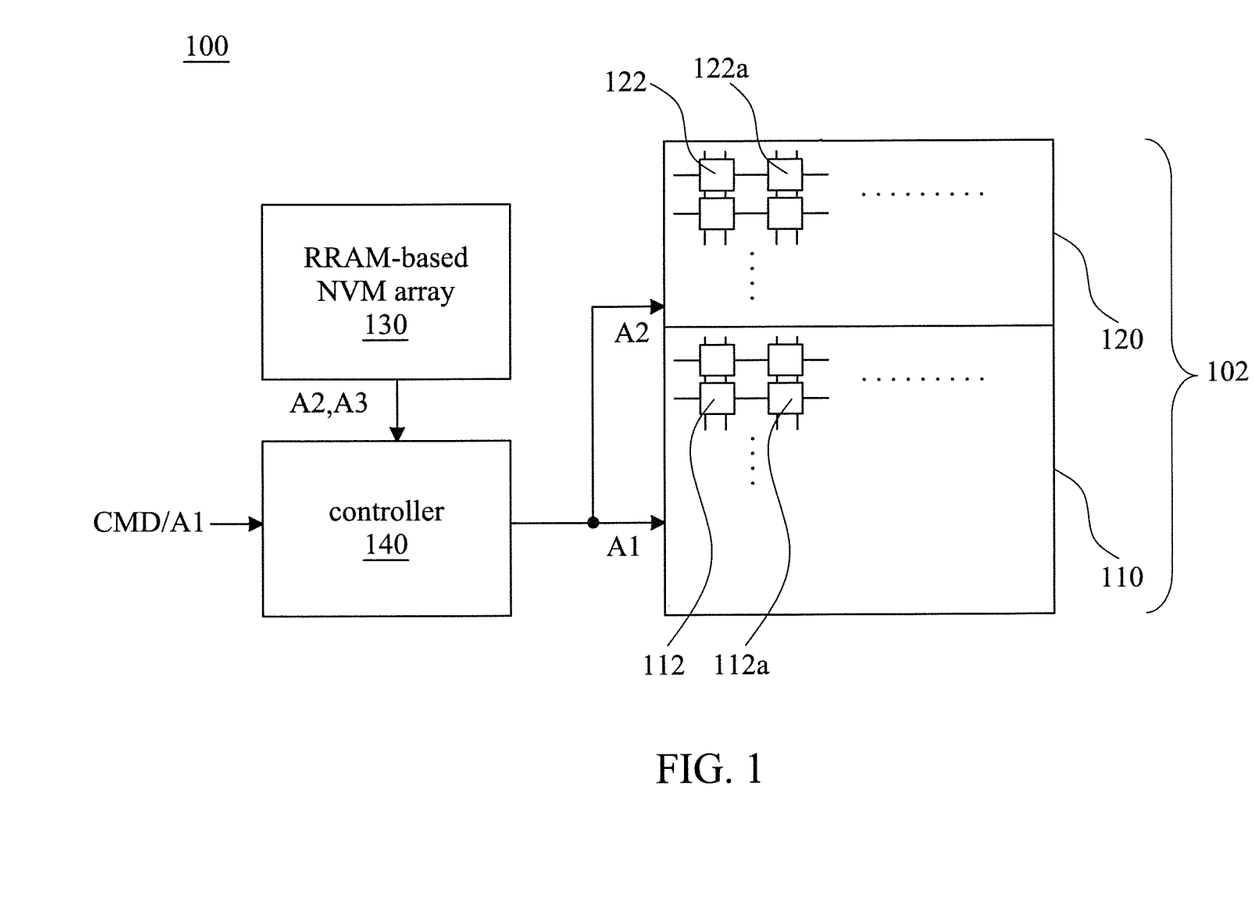
FIG. 1 is a schematic diagram of a memory device in accordance with various embodiments of the present disclosure.

FIG. 1 is a schematic diagram of a memory device 100 in accordance with various embodiments of the present disclosure. In these embodiments, the memory device 100 includes a memory region 102, a resistive-read-access-memory-based (RRAM-based or ReRAM-based) non-volatile memory (NVM) array 130, and a controller 140. The RRAM-based non-volatile memory array 130 is coupled to the memory region 102 and the controller 140. The controller 140 is coupled to the memory region 102.

In various embodiments, the memory region 102 includes a main memory array 110 and a redundancy array 120. The main memory array 110 includes a plurality of main memory cells 112 arranged in a matrix form. The redundancy array 120 includes a plurality of redundancy memory cells 122 arranged in a matrix form.

In various embodiments, one of the redundancy memory cells 122 is configured to be in place of a corresponding one of the main memory cells 112 when the corresponding one of the main memory cells 112 is failed. For illustration, a failed main memory cell is referred to as the main memory cell 112a, and a repair redundancy memory cell is referred to as the redundancy memory cell 122a. When the main memory cell 112a is proved to be failed during a test stage, the failed main memory cell 112a is replaced (or repaired) by the redundancy memory cell 122a.

In some embodiments, the RRAM-based non-volatile memory array 130 is configured to record the repair information. For illustration, the RRAM-based non-volatile memory array 130 records a corresponding relationship between the failed main memory cell 112a and the repair memory cell 122a.

In addition, in various embodiments, the RRAM-based non-volatile memory array 130 includes a plurality of RRAM-based non-volatile memory cells 132 (labeled in FIG. 3) arranged in a matrix, and a portion of the non-volatile memory cells 132 constitute a one-time-programmable (OTP) memory array to record the repair information described above.

In some embodiments, the controller 140 is configured to receive an access command CMD, and is configured to selectively read data from (or write data into) the main memory cells 112 or the redundancy memory cells 122 according to the access command CMD.

In some approaches, e-fuses are used to record the repair information. Compared with the aforementioned approaches, the RRAM-based non-volatile memory array 130 is used in the memory device 100 to record the repair information. Since the sizes of the bit cells in an RRAM memory are far smaller than the sizes of the bit cells in the e-fuses, the size of the RRAM-based non-volatile memory array 130 becomes small. Hence, with the configuration above, the size of the memory device 100 is minimized.

In addition, compared to the power utilized to program (or burn) the e-fuses, the power utilized to form an RRAM cell is much lower. Thus, a memory device with a non-volatile memory array having smaller bit cell size and lower power consumption is realized.

The phrase "to form an RRAM cell" used above indicates converting the RRAM cell from having a high resistive state (HRS) to having a low resistive state (LRS).

In the following paragraphs, details of operations of the memory device 100 are described with reference to FIG. 2.

Figure 2:
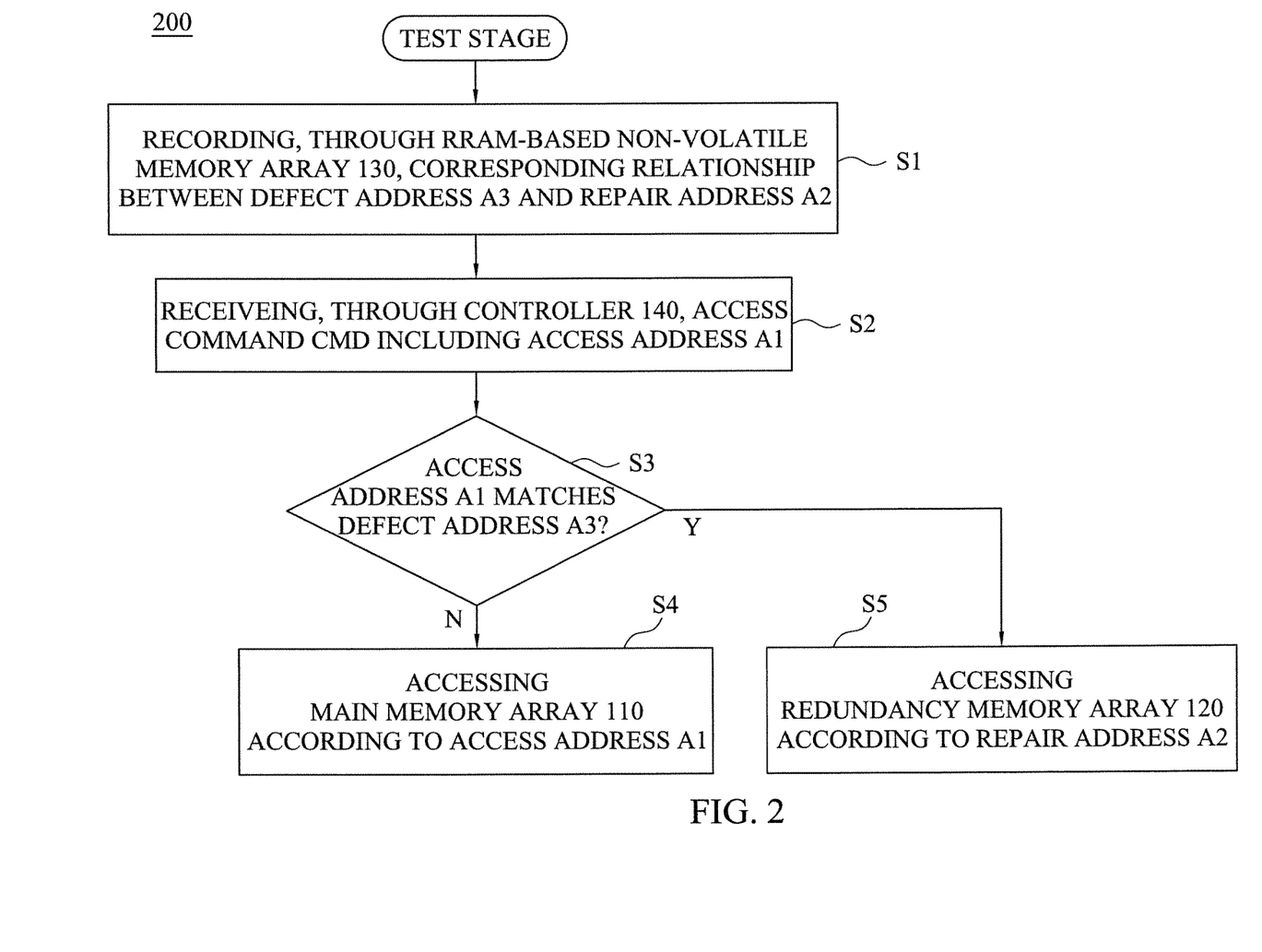
FIG. 2 is a flow chart of a method illustrating operations of the memory device in FIG. 1 in accordance with various embodiments of the present disclosure.

FIG. 2 is a flow chart of a method 200 illustrating operations of the memory device 100 in FIG. 1 in accordance with various embodiments of the present disclosure.

In the following paragraphs, details of the RRAM-based non-volatile memory array 132 are described with reference to FIG. 3.

Figure 3:
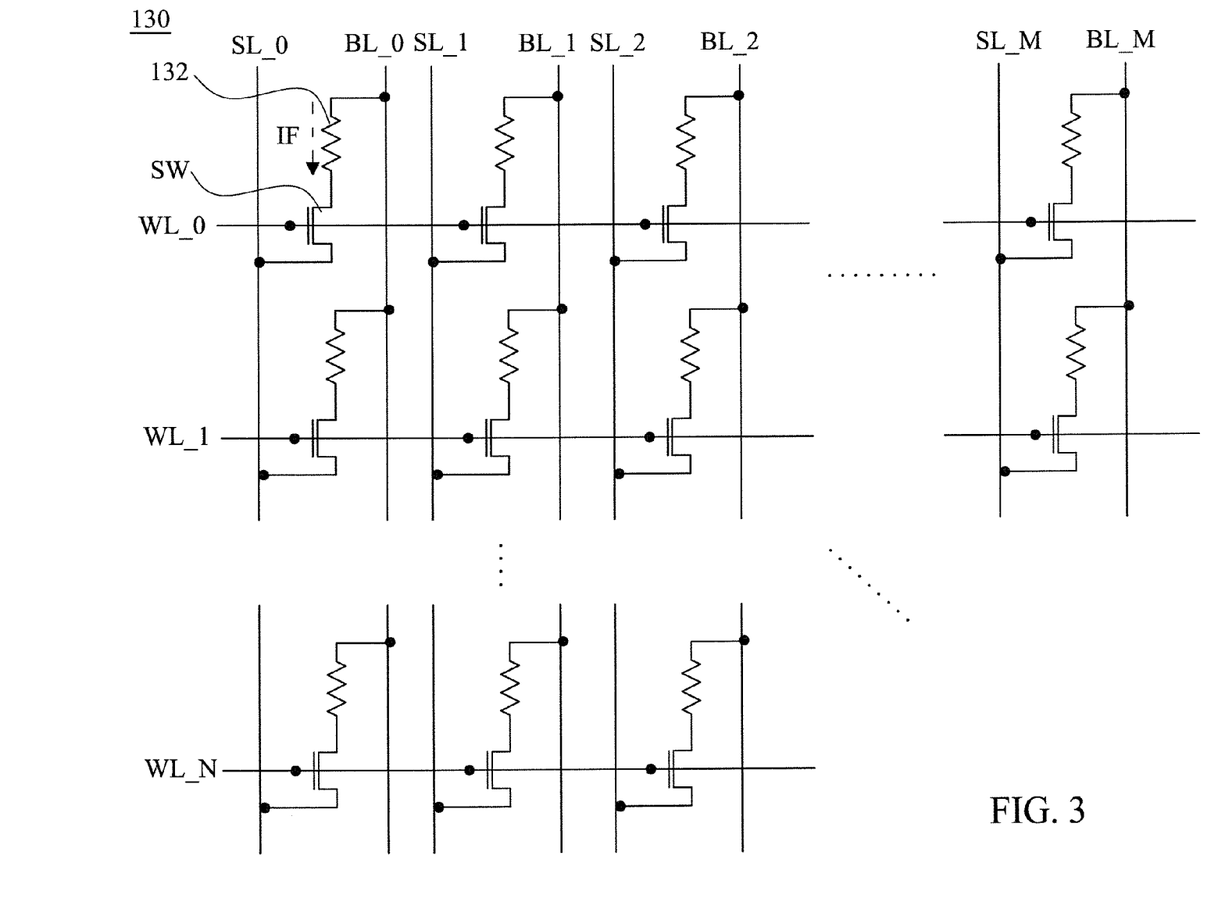
FIG. 3 is a schematic diagram of the RRAM-based non-volatile memory array in FIG. 1 in accordance with various embodiments of the present disclosure.

FIG. 3 is a schematic diagram of the RRAM-based non-volatile memory array 132 in FIG. 1 in accordance with various embodiments of the present disclosure.

As illustrated FIG. 3, first ends of the RRAM-based non-volatile memory cells 132 are coupled to bit lines from $BL\_0$ to $BL\_M$, respectively, in which M is a positive integer. Second ends of the RRAM-based non-volatile memory cells 132 are coupled to first ends of switches SW, respectively. Second ends of the switches SW are coupled to source lines from $SL\_0$ to $SL\_M$, respectively. Control ends of the switches SW are coupled to word lines from $WL\_0$ to $WL\_N$, respectively, in which N is a positive integer.

Details of the operations of RRAM-based non-volatile memory cells 132 are described below with reference to table T1 illustrated below. Table T1 illustrates the voltages applied to the word lines from $WL\_0$ to $WL\_N$, the bit lines from $BL\_0$ to $BL\_M$, and the source lines from $SL\_0$ to $SL\_M$ during "Form" operation and "Read" operation in accordance with various embodiments.

TABLE T1

| | WL | | BL | | SL | | |
| --- | --- | --- | --- | --- | --- | --- | --- |
| | select | unselect | select | unselect | Select | unselect | Note |
| Form | 1.0~1.8 V | 0 V | 2~0.4 V/1 ms | 0 V | 0 V | 0 V | IF: 20~250 μA |
| Read | 1.1 V | 0 V | 0.2~0.4 V | 0 V | 0 V | 0 V | |

In operation S1, after a test stage, the RRAM-based non-volatile memory array 130 records repair information of the failed main memory cell 112a. In some embodiments, the repair information includes a corresponding relationship between a defect address A3 corresponding to the failed main memory cell 112a and a repair address A2 corresponding to the repair memory cell 122a.

In operation S2, the controller 140 receives the access command CMD including an access address A1.

Subsequently, in operation S3, the controller 140 compares the access address A1 and the defect address A3, in order to determine whether the access address A1 matches the defect address A3. If not, operation S4 is executed. If so, operation S5 is executed.

In operation S4, in a case that the access address A1 does not match the defect address A3, which indicates that the access address A1 corresponds to a normal main memory cell 112, the controller 140 accesses the main memory array 110 according to the access memory A1.

In operation S5, in a case that the access address A1 matches the defect address A3, which indicates that the access address A1 corresponds to the failed main memory cell 112a, the controller 140 accesses the redundancy memory 120 according to the repair address A2 corresponding to the defect address A3. In other words, when the access address A1 corresponds to the failed main memory cell 112a, the controller 140 accesses the repair memory cell 122a, instead of the failed main memory cell 112a, according to the repair address A2.

The above illustrations include exemplary operations, but the operations are not necessarily performed in the order shown. Operations may be added, replaced, changed order, and/or eliminated as appropriate, in accordance with the spirit and scope of various embodiments of the present disclosure.

For illustration, as shown in the "Form" entry, while forming the RRAM-based non-volatile memory cells 132 which is related to the lines $SL\_0$, $BL\_0$, and $WL\_0$ illustrated in FIG. 3, the voltage applied to the line $WL\_0$ has a range between approximately 1.0 volt and approximately 1.8 volts. In such condition, the voltage applied to the line $BL\_0$ has a range between approximately 2 volts and approximately 4 volts, and is maintained for substantially 1 millisecond. The voltage applied to the line $SL\_0$ is substantially 0 volts. The current IF flowing through the corresponding RRAM-based non-volatile memory cell 132 has a range between approximately 20 microamperes and approximately 250 microamperes.

On the other hand, as shown in the "Read" entry, while reading the RRAM-based non-volatile memory cell 132 which is related to the lines $SL\_0$, $BL\_0$, $WL\_0$ illustrated in FIG. 3, the voltage applied to the line $WL\_0$ is substantially 1.1 volts, the voltage applied to the line $BL\_0$ has a range between approximately 0.2 volts and approximately 0.4 volts, and the voltage applied to the line $SL\_0$ is substantially 0 volts.

The values above are given for illustrative purposes. Other values are within the contemplated scope of the present disclosure.

In various embodiments, the RRAM-based non-volatile memory array 130 is manufactured by sandwiching a metal oxide layer between a top electrode and a bottom electrode. For example, the metal oxide material layer is fabricated by one of Hafnium oxide (HfOx), Tantalum oxide (TaOx), Titanium oxide (TiOx), etc, and the combinations thereof. The top electrode is fabricated by one of Platinum (Pt), Titanium (Ti), Titanium nitride (TiN), Tantalum nitride (TaN), etc, and the combinations thereof. The bottom electrode is fabricated by one of Titanium (Ti), Titanium nitride (TiN), Tantalum nitride (TaN), etc, and the combinations thereof. The materials mentioned above are given for illustrative purposes. Other materials are within the contemplated scope of the present disclosure.

In some embodiments, the memory region 102 is a static-random-access-memory-based (SRAM-based) memory region, and the main memory array 110 and the redundancy memory array 120 are SRAM-based memory arrays. In some other embodiments, the memory region 102 is a dynamic-random-access-memory-based (DRAM-based) memory region, and the main memory array 110 and the redundancy memory array 120 are DRAM-based memory arrays. In various embodiments, the memory region 102 is an RRAM-based memory region, and the main memory array 110 and the redundancy memory array 120 are RRAM-based memory arrays. The types of the memory region 102 above are given for illustrative purposes. Other types of the memory region 102 are within the contemplated scope of the present disclosure.

Figure 4:
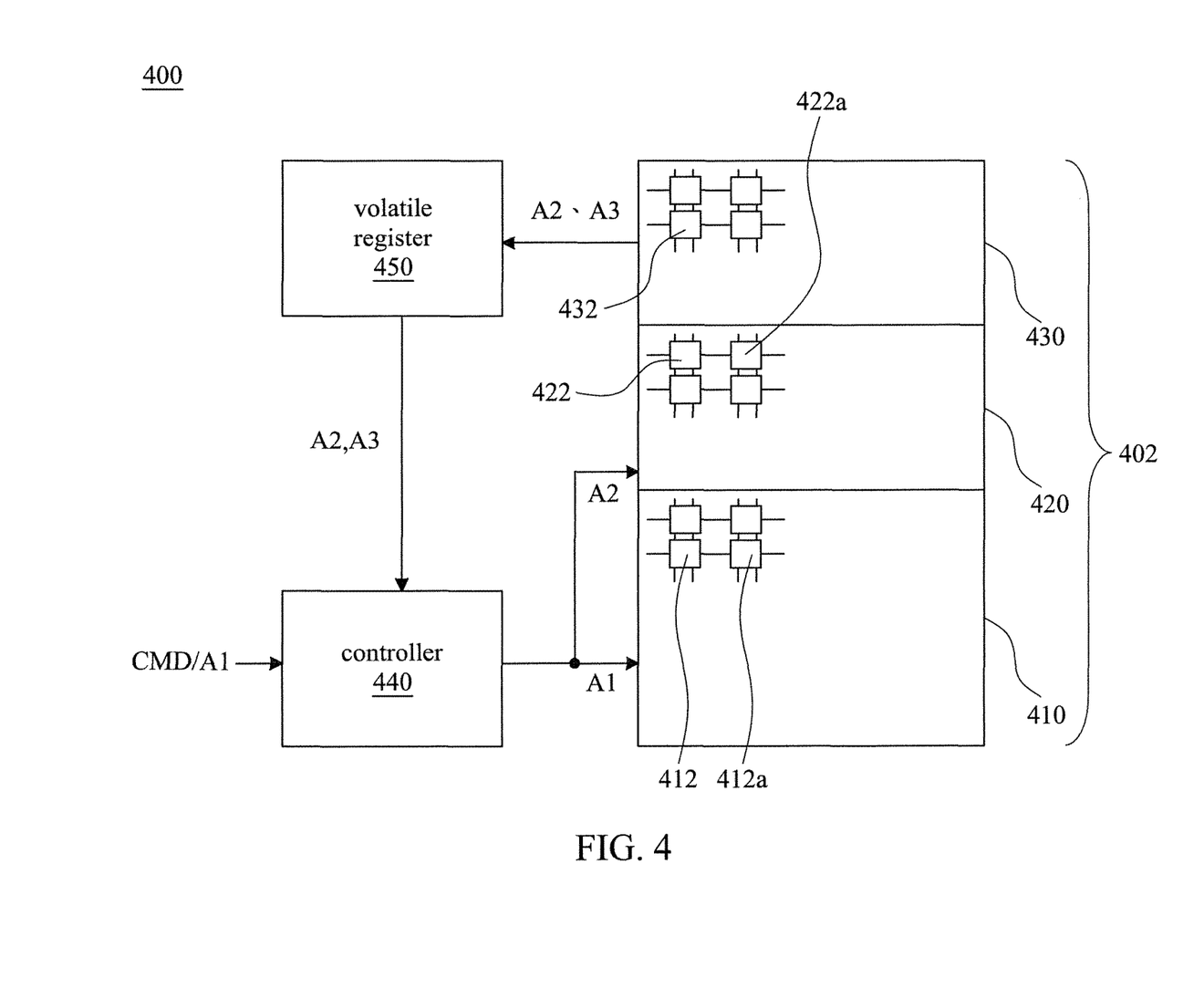
FIG. 4 is a schematic diagram of a memory device in accordance with alternative embodiments of the present disclosure.

FIG. 4 is a schematic diagram of a memory device 400 in accordance with alternative embodiments of the present disclosure.

In these embodiments, the memory device 400 includes a memory region 402, a controller 440, and a volatile register 450. The volatile register 450 is coupled to the memory region 402 and the controller 440. The controller 440 is coupled to the memory region 402.

In some embodiments, the memory region 402 is an RRAM-based memory region. The memory region 402 includes an RRAM-based main memory array 410, an RRAM-based redundancy memory array 420, and an RRAM-based non-volatile memory array 430. The RRAM-based main memory array 410, the RRAM-based redundancy memory array 420, and the RRAM-based non-volatile memory array 430 are separately defined in the memory region 402. In other words, in these embodiments, all of the RRAM-based main memory array 410, the RRAM-based redundancy memory array 420, and the RRAM-based non-volatile memory array 430 are integrated into a single one RRAM memory region, which is the RRAM-based memory region 402. In such configuration, the cost of manufacturing the main memory array 410, the redundancy memory array 420, and the RRAM-based non-volatile memory array 430 is minimized.

In some embodiments, the configurations in the memory device 400 are similar to the embodiments related to FIG. 1. Therefore, aspects of these embodiments related to the memory device 400, that are similar to those of the previous embodiments, are not further detailed herein.

In some embodiments, the volatile register 450 is configured to temporarily store the repair information fixed in the RRAM-based non-volatile memory array 430 and provide the repair information for the controller 440. For example, when the memory device 400 is powered up, the volatile register 450 receives and temporarily stores the repair information read from the RRAM-based non-volatile memory array 430. For another example, when the repair information fixed in the RRAM-based non-volatile memory array 430 is updated, the volatile register 450 receives and stores the updated repair information read from the RRAM-based non-volatile memory array 430.

In the following paragraphs, details of the operations of the memory device 400 are described with reference to FIG. 5.

Figure 5:
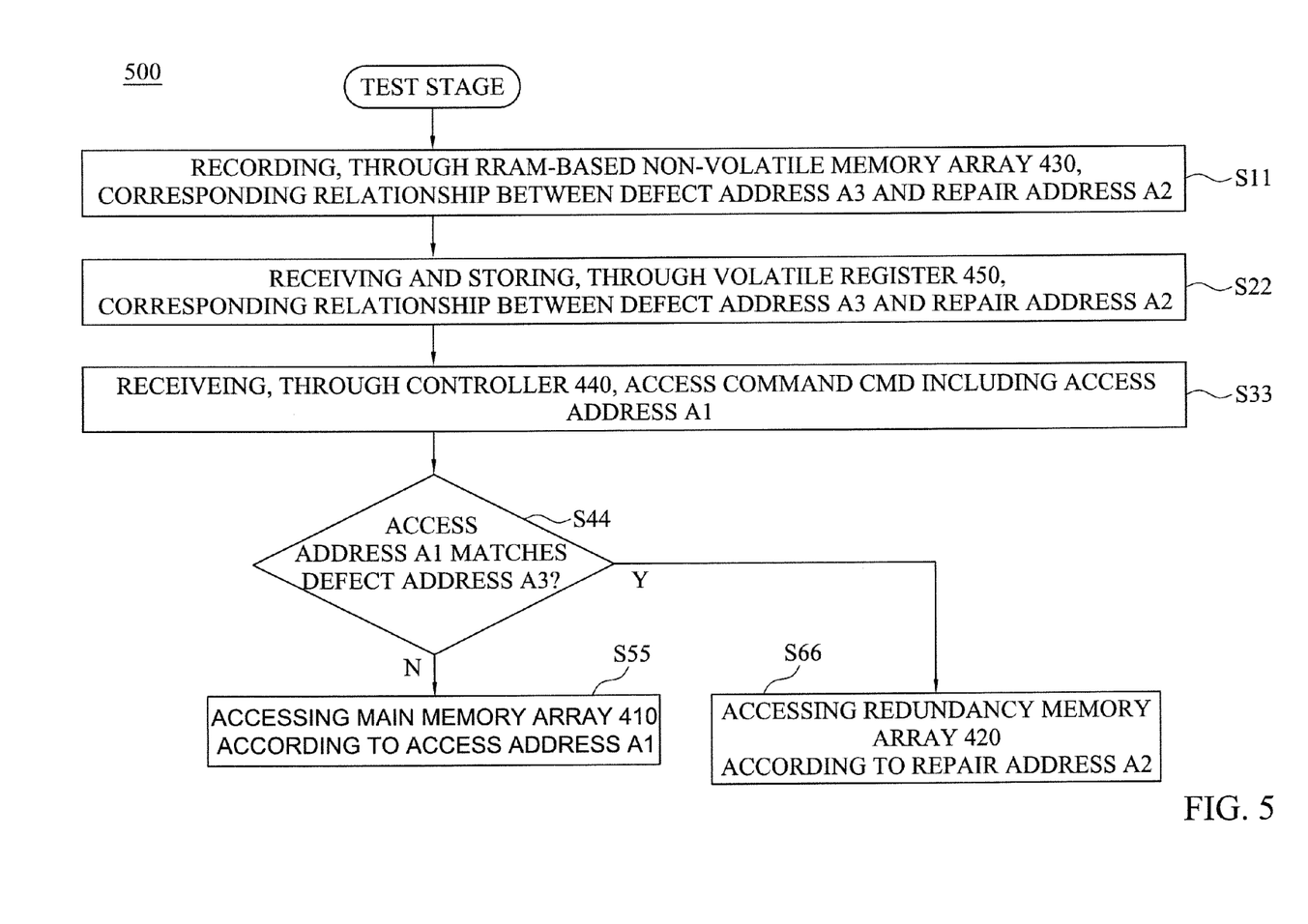
FIG. 5 is a flow chart of a method illustrating operations of the memory device in FIG. 4 in accordance with various embodiments of the present disclosure.

FIG. 5 is a flow chart of a method 500 illustrating operations of the memory device 400 in FIG. 4 in accordance with various embodiments of the present disclosure.

In operation S11, after a test stage, the RRAM-based non-volatile memory array 430 records repair information of the failed main memory cell 412a. In some embodiments, the repair information includes a corresponding relationship between a defect address A3 corresponding to the failed main memory cell 412a and a repair address A2 corresponding to the repair memory cell 422a.

In operation S22, the volatile register 450 receives and temporarily stores the repair information read from the RRAM-based non-volatile memory array 430.

In operation S33, the controller 440 receives the access command CMD including an access address A1.

Subsequently, in operation S44, the controller 440 compares the access address A1 and the defect address A3, in order to determine whether the access address A1 matches the defect address A3. If not, operation S55 is executed. If so, operation S66 is executed.

In operation S55, in a case that the access address A1 does not match the defect address A3, which indicates that the access address A1 corresponds to a normal main memory cell 412, the controller 440 accesses the main memory array 410 according to the access memory A1.

In operation S66, in a case that the access address A1 matches the defect address A3, which indicates that the access address A1 corresponds to the failed main memory cell 412a, the controller 440 accesses the redundancy memory 420 according to the repair address A2 corresponding to the defect address A3. In other words, when the access address A1 corresponds to the failed main memory cell 412a, the controller 440 accesses the repair memory cell 422a, instead the failed main memory cell 412a, according to the repair address A2.

The above illustrations include exemplary operations, but the operations are not necessarily performed in the order shown. Operations may be added, replaced, changed order, and/or eliminated as appropriate, in accordance with the spirit and scope of various embodiments of the present disclosure.

In addition, in the operation S44, since the defect address A3 has been stored in volatile register 450, the controller 440 gets the defect address A3 from the volatile register 450 instead of reading the RRAM-based non-volatile memory array 430. Therefore, compared with a memory device without the volatile register 450, the memory device 400 described above has a quicker access speed.

In some embodiments, the fabrication of the memory region 402 can be ascertained by referring to the fabrication of the RRAM-based non-volatile memory array 130 in the above paragraphs, and a description in this regard will not be repeated herein.

Furthermore, the configurations and the operations of the RRAM-based non-volatile memory cells 432 can be ascertained by referring to paragraphs related to FIG. 3 and the table T1 in the above paragraphs, and thus they are not further detailed herein.

In some embodiments, a device is disclosed that includes a storage region and an RRAM-based non-volatile storage array. The storage region includes a first storage array and a second storage array. The first storage array includes a plurality of first storage cells. The second storage array includes a plurality of second storage cells. The second storage cells are configured to be in place of the first storage cells. The RRAM-based non-volatile storage array is configured to record at least one corresponding relationship between the first storage cells and the second storage cells.

Also disclosed is a device that includes a main memory array, a redundancy memory array, and an RRAM-based non-volatile memory array. The main memory array includes a plurality of main memory cells. The redundancy memory array includes a plurality of redundancy memory cells. The RRAM-based non-volatile memory array is configured to record a corresponding relationship between a defect address corresponding to at least one of the main memory cells and a repair address corresponding to at least one of the redundancy memory cells in a case that the at least one of the main memory cells is failed.

Also disclosed is a method that includes the operations below. Through an RRAM-based non-volatile memory array, at least one corresponding relationship between a plurality of main memory cells of a main memory array and a plurality of redundancy memory cells of a redundancy memory array is recorded.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A device comprising:
a resistive-read-access-memory-based (RRAM-based or ReRAM-based) non-volatile storage array configured to record a corresponding relationship between a first storage cell and a second storage cell that is configured to be in place of the first storage cell,
wherein in a condition that an RRAM-based memory region is provided, the RRAM-based non-volatile storage array, the first storage cell, and the second storage cell are integrated in the RRAM-based memory region.

2. The device as claimed in claim 1, wherein the RRAM-based non-volatile storage array is configured to provide a controller with a defect address corresponding to the first storage cell, so that the controller accesses the second storage cell in a case that a received access address matches the defect address.

3. The device as claimed in claim 2, wherein the RRAM-based non-volatile storage array provides a repair address corresponding to the second storage cell to the controller, so that the controller accesses the second storage cell according to the repair address.

4. The device as claimed in claim 3, wherein the RRAM-based non-volatile storage array is configured to record a corresponding relationship between the defect address and the repair address.

5. The device as claimed in claim 1, wherein the RRAM-based non-volatile storage array is configured to record a corresponding relationship between a defect address corresponding to the first storage cell, and a repair address corresponding to the second storage cell, and the second storage cell is accessed based on the relationship between the defect address and the repair address.

6. The device as claimed in claim 1, wherein in a condition that a random access memory region is provided, the first storage cell and the second storage cell are integrated in the random access memory region, and the first storage cell and the second storage cell separately belong to static-random-access-memory-based (SRAM-based) memory arrays or dynamic-random-access-memory-based (DRAM-based) memory arrays.

7. A device comprising:
an RRAM-based non-volatile memory array configured to record a corresponding relationship between a defect address corresponding to a main memory cell and a repair address corresponding to a redundancy memory cell in a case that the main memory cell is failed,
wherein in a condition that an RRAM-based memory region is provided, the RRAM-based non-volatile memory array, the main memory cell, and the redundancy memory cell are integrated in the RRAM-based memory region.

8. The device as claimed in claim 7, wherein the RRAM-based non-volatile memory array is configured to provide a controller with the defect address corresponding to the main memory cell, so that the controller accesses the redundancy memory cell in a case that a received access address matches the defect address.

9. The device as claimed in claim 8, wherein the RRAM-based non-volatile memory array provides the repair address corresponding to the redundancy memory storage cell to the controller, so that the controller accesses the redundancy memory storage cell according to the repair address.

10. The device as claimed in claim 7, wherein the redundancy memory cell is accessed according to the corresponding relationship between the defect address and the repair address.

11. The device as claimed in claim 7, wherein in a condition that a random access memory region is provided, the main memory cell and the redundancy memory cell are integrated in the random access memory region, and the main memory cell and the redundancy memory cell separately belong to SRAM-based memory arrays or DRAM-based memory arrays.

12. A method comprising:
recording, through an RRAM-based non-volatile memory array, a corresponding relationship between a main memory cell and a redundancy memory cell,
wherein in a condition that an RRAM-based memory region is provided, the RRAM-based non-volatile memory array, the main memory cell, and the redundancy memory cell are integrated in the RRAM-based memory region.

13. The method as claimed in claim 12, wherein recording the corresponding relationship between the main memory cell and the redundancy memory cell further comprises:
recording, through the RRAM-based non-volatile memory array, a corresponding relationship between a defect address and a repair address corresponding to one of the redundancy memory cell in a case that the main memory cell corresponding to the defect address is failed.

14. The method as claimed in claim 13, further comprising:
providing the defect address to a controller, so that the controller accesses the redundancy memory cell in a case that a received access address matches the defect address.

15. The method as claimed in claim 13, further comprising:
providing the repair address to a controller, so that a controller accesses the second storage cell according to the repair address.

16. The method as claimed in claim 13, wherein the redundancy memory cell is accessed according to the corresponding relationship between the defect address and the repair address.

17. The method as claimed in claim 12, wherein in a condition that a random access memory region is provided, the main memory cell and the redundancy memory cell are integrated in the random access memory region, and the main memory cell and the redundancy memory cell separately belong to SRAM-based memory arrays or DRAM-based memory arrays.

18. The device as claimed in claim 1, wherein in the condition that the RRAM-based memory region is provided, each of the first storage cell and the second storage cell is an RRAM-based storage cell.

19. The device as claimed in claim 7, wherein in the condition that the RRAM-based memory region is provided, each of the main memory cell and the redundancy memory cell is an RRAM-based memory cell.

20. The method as claimed in claim 12, wherein in the condition that the RRAM-based memory region is provided, each of the main memory cell and the redundancy memory cell is an RRAM-based memory cell.

* * * * *